United States Patent [19]
Kojima et al.

[11] Patent Number: 5,627,468
[45] Date of Patent: May 6, 1997

[54] METHOD AND SYSTEM FOR CARRYING OUT MAGNETIC RESONANCE IMAGING USING THE MTC EFFECT FOR ANGIOGRAPHY

[75] Inventors: Fumitoshi Kojima; Mitsue Miyazaki, both of Otawara, Japan

[73] Assignee: Kabushiki Kaisha Toshiba, Kawasaki, Japan

[21] Appl. No.: 236,544

[22] Filed: May 2, 1994

[30] Foreign Application Priority Data

May 12, 1993 [JP] Japan .................................. 5-110735

[51] Int. Cl.$^6$ ...................... G01R 33/563; A61B 5/055
[52] U.S. Cl. ........................................ 324/307; 128/653.3
[58] Field of Search ............................... 324/307, 309, 324/318, 321, 300, 306, 316; 128/653.2, 653.3, 653.4, 653.5

[56] References Cited

U.S. PATENT DOCUMENTS

| | | |
|---|---|---|
| 5,050,609 | 9/1991 | Balaban et al. . |
| 5,270,652 | 12/1993 | Dixon et al. .......................... 324/309 |
| 5,320,099 | 6/1994 | Roberts et al. ................... 324/309 X |
| 5,339,035 | 8/1994 | Schneider et al. ...................... 324/309 |
| 5,348,012 | 9/1994 | Kojima ..................................... 324/306 |
| 5,364,931 | 11/1994 | Flamig et al. ........................... 324/309 |

*Primary Examiner*—Sandra L. O'Shea
*Assistant Examiner*—Roger Phillips
*Attorney, Agent, or Firm*—Ronald L. Yin; Limbach & Limbach LLP

[57] ABSTRACT

A magnetic resonance imaging method and system utilizing a magnetization transfer contrast pulse that includes executing a first sequence including the application of the magnetization transfer contrast pulse to an examinee and executing a second sequence for acquiring a magnetic resonance angiography image data related to a predetermined imaging plane. The first sequence further includes the step of applying a slice gradient magnetic field for spatially selectively exciting a predetermined magnetization transfer contrast excitation plane at substantially the same timing as that of the magnetization transfer contrast pulse. A predetermined gradient magnetic field is applied by a gradient magnetic field application means in a manner superimposing upon a predetermined static magnetic field. An RF transmitting/receiving means is arranged for transmitting an RF pulse to an examinee and receiving a magnetic resonance signal from the examinee. The gradient magnetic field application means and the RF transmitting/receiving means is controlled by a control means in accordance with the predetermined pulse sequence.

10 Claims, 5 Drawing Sheets

METHOD AND SYSTEM FOR CARRYING OUT MAGNETIC RESONANCE IMAGING USING THE MTC EFFECT FOR ANGIOGRAPHY

BACKGROUND OF THE INVENTION

The present invention relates to method and system for carrying out magnetic resonance imaging and, more particularly, relates to a magnetic resonance imaging method and magnetic resonance imaging apparatus in which a magnetization transfer contrast pulse is used to acquire magnetic resonance angiography image data.

Magnetic resonance (MR) angiography is a well-known imaging method in a medical field, for example, as means for imaging blood vessels, such as those in the head (brain) of an examinee or patient. A technique has recently been developed that includes applying a method called MTC (Magnetization Transfer Contrast) to the MR angiography to improve delineation capabilities for small vessels by increasing the signal intensities for the blood vessels in relation to those of the parenchyma.

Namely, the Magnetization. Transfer Contrast (MTC) method has proven to be a powerful method to increase contrast in magnetic resonance imaging (MRI) and angiography (MRA), using the relaxation difference in tissues. The magnetization transfer technique, originally described by Forsen and Hoffman, was first employed in imaging using continuous wave off-resonance irradiation. A pulsed method, using an on-resonance binominal pulse, was designed to obtain MTC in many imaging sequences and has been applied in angiography. The MTC effects on brain background as well as on stationary, freshly drawn, heparinized vanous blood were examined using a pulsed method and an off-resonance Gaussian RF pulse. Improved brain background suppression using the MTC pulse was reported. However, the reduction of the blood signal was too severe to be neglected in such a method.

FIG. 6 shows the spectra of protons in water and in macromolecules.

As can be seen from this figure, a proton contained in water has a resonant frequency of about 64 MHz, for example, under a magnetic field of 1.5 tesla (T). A proton contained in macromolecules, on the other hand, is characterized by its wide frequency bandwidth.

Here, prior to execution of the MR angiography sequence, if a proton in water is selectively excited by means of an RF (radio-frequency) pulse called MTC pulse, and the frequency is shifted for example by 500 Hz from the resonant frequency, the signal level from the proton in the macromolecules is reduced as indicated by the dashed line. In addition, the MR signal level from protons contained in water is also reduced as indicated by the dashed line.

This signal level reduction presumably results from the crossover relaxation or exchange of protons in water with the protons in the macromolecules. By utilizing this MTC effect, an image having a contrast different from conventional ones may be obtained in accordance with the ratio by which the macromolecules exist. Furthermore, since there is also an effect of greatly reduced signal level of parenchyma portions in comparison to the signal level of blood vessel portions, the MTC technique is applied to angiography for depicting small blood vessels.

FIG. 7 is a brief sectional view showing a portion of an MRI (magnetic resonance imaging) apparatus, where an RF coil 10 to be used for both transmitting and receiving of signals is disposed around the head 9 of an examinee 8 such as patient.

In the case of employing such MRI apparatus, an MTC pulse is first transmitted from the RF coil 10 prior to execution of a pulse sequence for the MR angiography and, then, the MR angiography sequence such as the FE (field echo) method is applied.

A problem occurs, however, in the case of using a whole body type RF coil.

FIG. 8 shows an MRI apparatus having a whole body coil, where a whole-body coil 11 for transmitting only is disposed entirely around the examinee 8 and a head RF coil 12 for receiving only is only disposed around the head 9 of the examinee 8.

In such an MRI apparatus, the transmitting range of the MTC pulse to be transmitted from the whole body coil 11 extends along the length of the examinee from where the blood flows (heart side) into the head 9.

Therefore, for this reason, the blood flowing out of the heart flows into the head while the MTC pulse is applied repeatedly for many times, and a state of saturation of the flowing blood occurs in the sequence of the MR angiography which is to be subsequently performed.

Thus, even if MR angiography is applied, the signal level of the flowing blood becomes smaller and the S/N (signal/ noise) ratio related to depiction of the blood vessels is extremely worsened.

For this reason, the MTC pulse is not always applied to the MR angiography in a conventional MRI apparatus of the whole-body coil type.

SUMMARY OF THE INVENTION

An object of the present invention is to substantially eliminate defects or drawbacks encountered in the prior art and to provide a magnetic resonance imaging method and apparatus capable of executing a magnetic resonance angiography using magnetization transfer contrast pulse with respect to various types of RF coils.

This and other objects can be achieved according to the present invention by providing, in one aspect, a magnetic resonance imaging method utilizing a magnetization transfer contrast pulse, comprising the steps of:

executing a first pulse sequence inclusive of applying the magnetization transfer contrast pulse to an examinee; and executing a second pulse sequence for acquiring a magnetic resonance angiography image data related to a predetermined imaging plane, the first sequence further including the step of applying a slice gradient magnetic field for spatially selectively exciting a predetermined magnetization transfer contrast excitation plane at substantially the same timing as that of the magnetization transfer contrast pulse.

In a preferred embodiment, the magnetization transfer contrast pulse is constituted by superimposing an offset pulse on a pulse capable of carrying out spatial selective excitation and wherein a flip angle of the pulse capable of carrying out the spatial selective excitation is set to 6 to 78 µT. The magnetization transfer contrast excitation plane is set further from the heart of the examinee than the imaging plane, or the magnetic transfer contrast excitation plane is set closer to the heart of the examinee than the imaging plane.

The method further comprises the step of shielding a portion of the examinee by means of an RF shield member in the shape of sheet before the application of the magnetization transfer contrast pulse to the examinee.

In another aspect, there is provided a magnetic resonance imaging apparatus comprising:

a gradient magnetic field application means for applying a predetermined gradient magnetic field in a manner superimposing upon a predetermined static magnetic field;

an RF transmitting/receiving means capable of transmitting an RF pulse to an examinee and of receiving a magnetic resonance signal from the examinee;

means for defining a predetermined pulse sequence including a first sequence for applying a magnetization transfer contrast pulse and a second sequence for gathering magnetic resonance image data;

a control means for controlling the gradient magnetic field application means and the RF transmitting/receiving means in accordance with the predetermined pulse sequence, wherein a slice gradient magnetic field for spatially selectively exciting a predetermined magnetization transfer contrast excitation plane is applied in the first sequence at substantially the same timing as that of the magnetization transfer contrast pulse.

In a modified aspect, there is provided a magnetic resonance imaging apparatus comprising an RF coil of a whole-body type to be exclusively used for transmitting an RF pulse, such as a magnetization transfer contrast pulse, to an examinee and another coil to be exclusively used for receiving a magnetic resonance signal from the examinee, where an RF shield member capable of shielding the examinee from the magnetization transfer contrast pulse for a predetermined portion of the examinee is disposed inside the RF coil to be exclusively used for transmitting.

In the MR imaging method and the magnetic resonance imaging apparatus of the present invention, the first sequence, including the step of applying the MTC pulse to the examinee, is first executed. The MTC pulse is constituted by superimposing an offset pulse on a pulse, such as Gaussian pulse or sinc pulse, which is capable of performing the spatial selective excitation, where the flip angle of the Gaussian pulse, sinc pulse, etc. is set to 6 to 78 µT and more preferably 19 to 36 µT.

Here, a slice gradient magnetic field for selectively exciting a predetermined MTC excitation plane is applied at substantially the same timing as the MTC pulse. In applying the slice gradient magnetic field, the imaging plane is set between the heart of the examinee and the MTC excitation plane, or the MTC excitation plane is set between the heart of the examinee and the imaging plane.

Next, the second sequence for gathering MR angiography image data related to the predetermined imaging surface is executed.

Further, in the MR imaging method of the present invention, an RF shield member is first wound around the examinee and, then, MTC pulses are applied to the examinee.

While the MTC pulse exiting the whole-body type RF coil is transmitted toward all portions of the examinee, a portion of the examinee around which the RF shield member is wound around is not subjected to the MTC pulse, and therefore the flowing blood flows into the imaging region without being excited by the MTC pulse.

For this reason, when the second sequence is subsequently executed to acquire MR image data on the imaging surface, an intensive signal may be obtained from the flowing blood.

Furthermore, in the magnetic resonance imaging apparatus of the present invention, the MTC pulse is first applied to the examinee. Since an RF shield member capable of shielding a predetermined region of the examinee from the MTC pulse is disposed at the inside of the whole-body type RF coil which is to be exclusively used for transmitting, the MTC pulse is not applied to the portion of the examinee for which the RF shield is provided, even though the MTC pulse exiting the transmitting only RF coil is transmitted toward all portions of the examinee.

The flowing blood thus flows into the imaging region without being excited by the MTC pulses.

For this reason, when the second sequence is subsequently executed to gather MR image data on the imaging plane, an intensive signal may be obtained from the flowing blood.

The nature and further features of the present invention will be made more clear hereunder with reference to the accompanying drawings.

DESCRIPTION OF THE PREFERRED EMBODIMENTS

Figure 7:
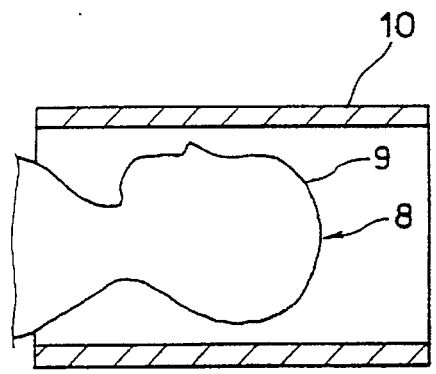
FIG. 7 is a view showing an RF coil to be used for both transmitting and receiving disposed around a head of an examinee according to the prior art.
Figure 8:
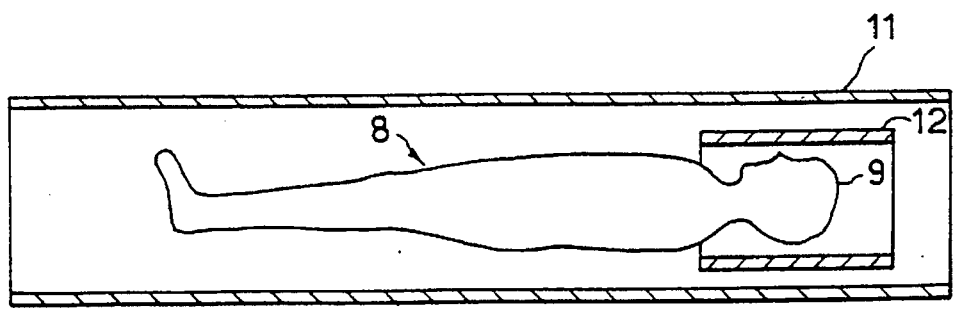
FIG. 8 is a view showing an RF coil to be used for transmitting only disposed around the whole length of the examinee and another RF coil to be used for receiving only disposed around the head according to the prior art.

A description will now be given with respect to an embodiment of method and system for the magnetic resonance imaging (MRI) according to the present invention with reference to the accompanying drawings. It should be noted that like reference numerals are added to elements or components, described hereunder, corresponding to those in FIGS. 7 and 8.

Figure 1:
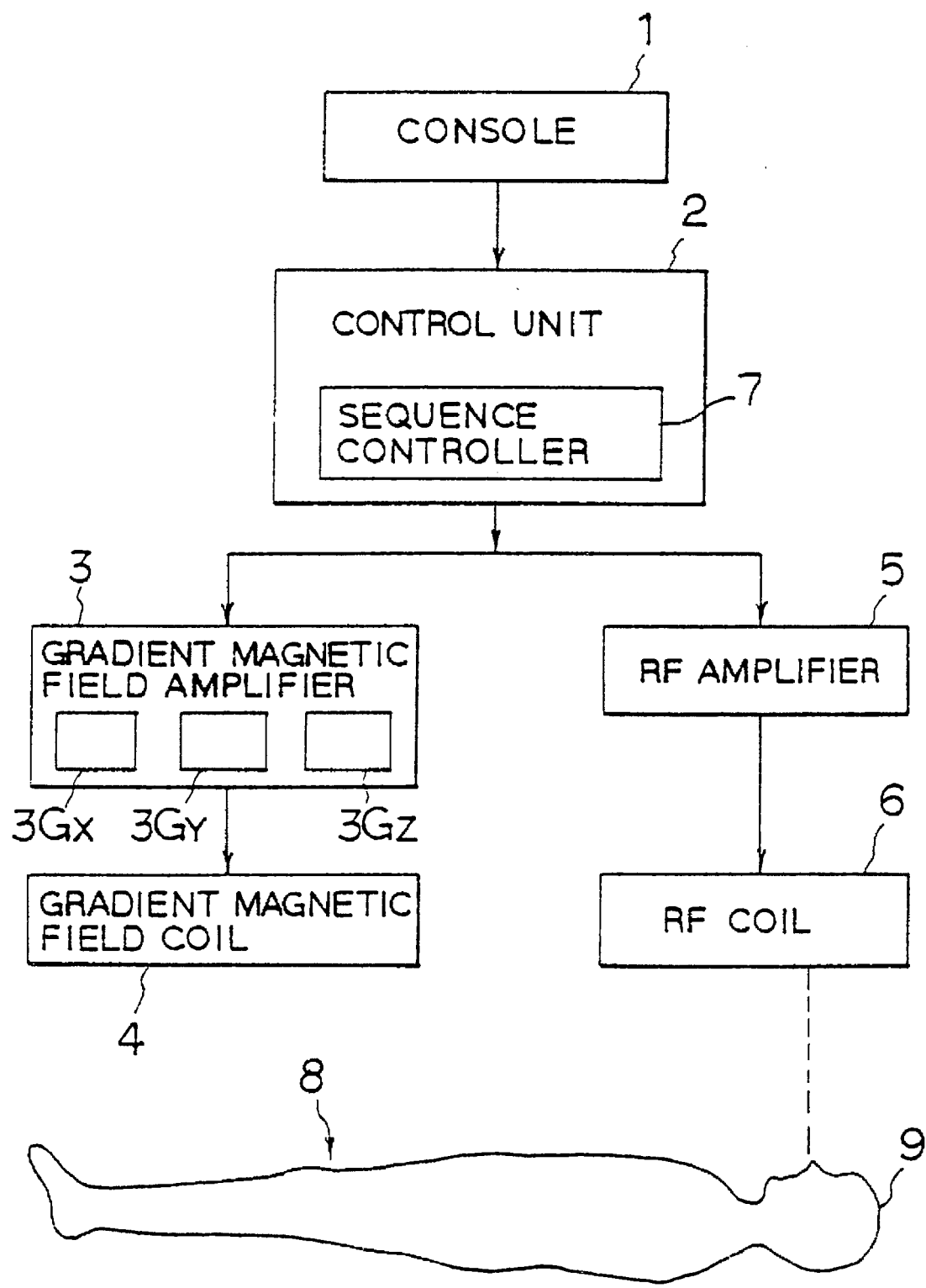
FIG. 1 is a block diagram showing a magnetic resonance imaging apparatus according to the present invention.

FIG. 1 shows a block diagram of a magnetic resonance imaging (MRI) system according to the present invention. Referring to FIG. 1, the MRI system comprises a gradient magnetic field amplifier means 3, generally including gradient magnetic amplifiers 3Gx, 3Gy and 3Gz for x, y and z axes in a coordinate system, and a gradient magnetic field coil 4 serving as gradient magnetic field application means capable of applying a predetermined gradient magnetic field in an overlapping manner on a predetermined static magnetic field which is generated by a magnet, not shown, a high-frequency (radio-frequency RF) amplifier 5 and an RF coil 6 serving as RF transmitting/receiving means capable of transmitting an RF pulse to an examinee 8 and of receiving an MR signal from the examinee, a control unit 2 serving as control means capable of controlling the gradient magnetic field application means and the RF transmitting/receiving means, and a console 1 for operating the control unit 2.

The control unit 2 includes a sequence controller 7 for controlling the gradient magnetic field amplifier 3 and the RF amplifier 5 in accordance with a predetermined pulse sequence.

Figure 2:
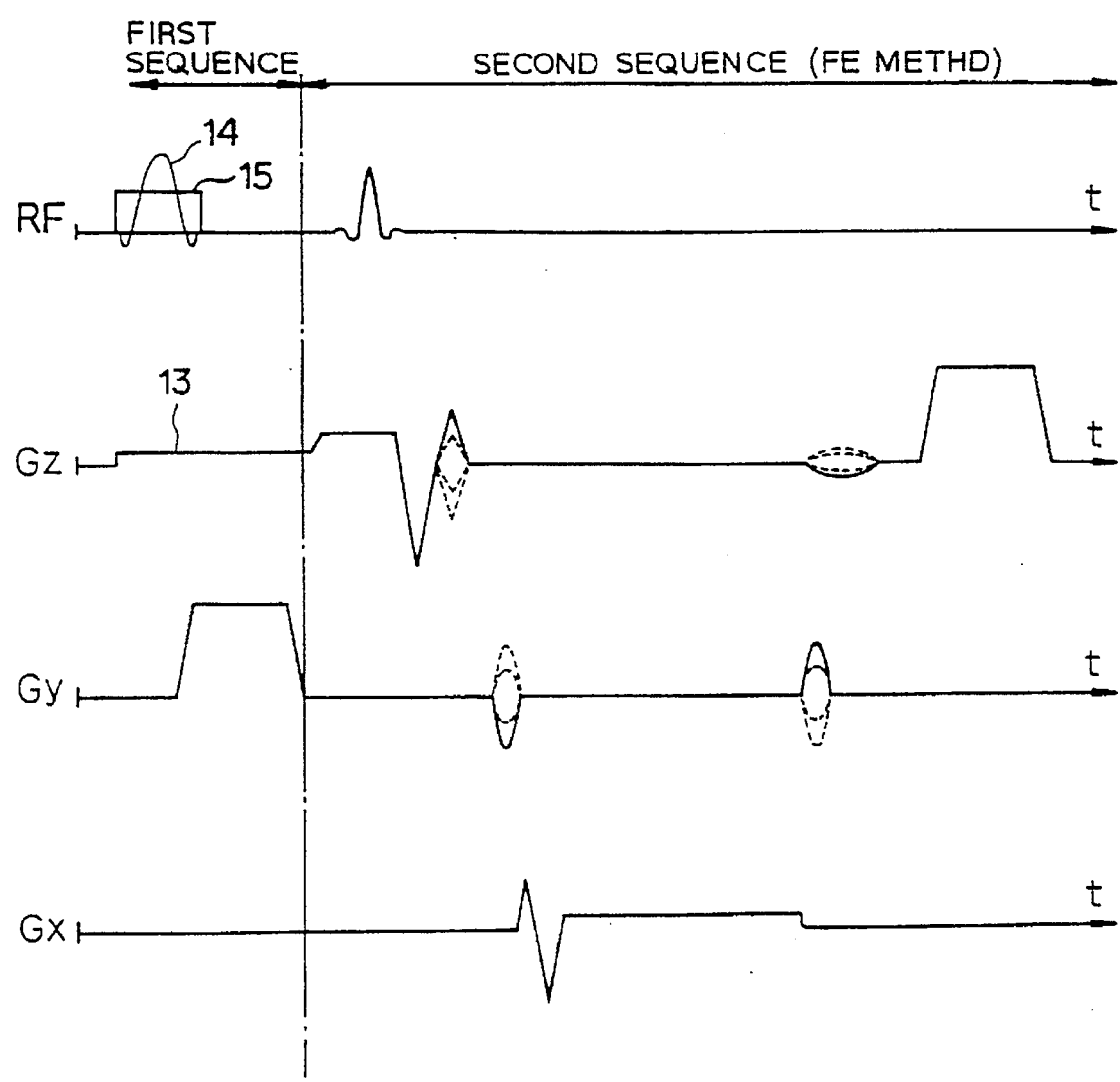
FIG. 2 shows a graph of a pulse sequence representing a method for carrying out the magnetic resonance imaging by using the apparatus of FIG. 1 according to the present invention.

FIG. 2 shows a pulse sequence to be executed by the sequence controller 7. The sequence controller 7 is adapted to execute a first sequence for applying an MTC pulse and a second sequence for acquiring MR image data. The second sequence is preferably effected for example by a field echo (FE) method.

In order that protons contained in macromolecules are excited in the frequency range shifted by a predetermined offset amount, for example 500 to 750 Hz, from the resonance frequency of protons contained in water, the MTC pulse is constituted by overlapping a pulse, for example a sinc function pulse (sinc pulse) 14, capable of spatially selectively exciting the resonance frequency of protons contained in water and an offset pulse 15 offset by the above described offset amount from the excitation frequency of the sinc pulse 14.

For the sinc pulse 14, the flip angle is set to 6 to 78 µT, preferably, 19 to 36 µT.

It should be noted that, while the flip angle in this example is represented by the intensity of the RF magnetic field, the flip angles 6 µT and 78 µT correspond to 90° and 1200°, respectively, if they are represented in terms of angles.

The first sequence furthermore includes the step of applying a slice gradient magnetic field 13 for selectively exciting a predetermined MTC excitation surface at substantially the same timing as the above described MTC pulse.

In the MR imaging method of the present embodiment, the first sequence is the first executed. That is, MTC pulse constituted by the sinc pulse 14 and the offset pulse 15 is applied to the examinee from the whole body type RF coil 11.

Here, the slice gradient magnetic field 13 for selectively exciting a predetermined MTC excitation surface is applied at substantially the same timing as the MTC pulse by using a gradient magnetic field coil.

Figure 3A:
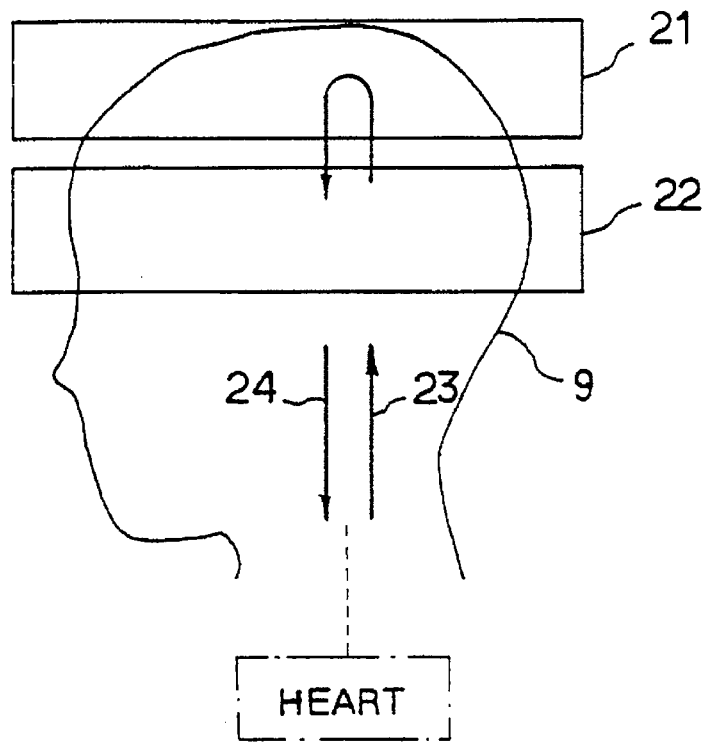
FIG. 3A is a view showing the relative position of the imaging plane and the MTC excitation plane when the arteries are to be emphasized.

Further, the slice gradient magnetic field 13 is set so that the relative position of the MTC excitation plane or surface and the imaging plane or surface to each other is obtained for example as shown in FIG. 3A, i.e., the MTC excitation plane 21 is located farther from the heart of the examinee than the imaging plane 22.

By applying the slice gradient magnetic field 13 in this manner, it is possible to limit the transmitting range of the MTC pulse to a predetermined MTC excitation plane, whereby no excitation of the flowing blood occurs on the side from which it flows in.

For this reason, an intensive signal may be obtained from the flowing blood when the second sequence is subsequently executed to acquire MR image data on the imaging plane.

Here, while the artery 23 having blood flowing into the head 9 from the heart provides an intensive MR signal because it is excited for the first time in the sequence of MR angiography as described, the vein 24 which returns to the heart through the vertex has already been excited at the MTC excitation plane 21 so that the MR signal thereof coming out of the imaging plane 22 becomes smaller.

Thus, even when a whole-body type RF coil is used, it is possible to control the signal level from the vein in a similar manner as the case of using a transmitting/receiving coil so as to relatively increase the signal level from the artery which is clinically more significant.

Further, since the MTC excitation plane 21 is set in the vicinity of the imaging surface 22 to apply the MTC pulse to such region, it is possible to increase the signal level of the blood vessel portions in relation to that from the parenchyma portion.

Thus, small blood vessels may be imaged conspicuously.

While, in the above described embodiment, the MTC pulse is constituted by a sinc pulse and an offset pulse, other pulses, such as Gaussian pulses, are capable of selective excitation that may be used instead of the sinc pulse to constitute an MTC pulse.

Further, while, in the above described embodiment, the description has been given with respect to the case of using the RF coil 11 which is to be exclusively used for transmitting, the MR imaging method of the present embodiment may also be applied to the case of using an RF coil 10 which is for both transmitting and receiving.

Figure 3B:
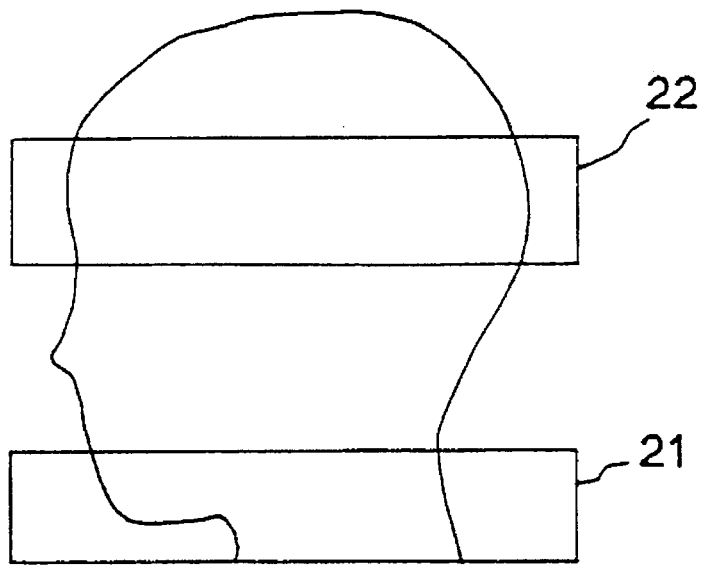
FIG. 3B is a view showing the relative position of the imaging plane and the MTC excitation plane when the veins are to be emphasized.

Further, while, in the above described embodiment, the MTC excitation plane is set farther from the heart then the imaging plane 22, it is also possible as shown in FIG. 3B to locate the MTC excitation plane 21 closer to the heart than the imaging plane 22.

By using such an arrangement, it is possible to obtain an MR angiography image data which emphasizes the vein in relation to the artery.

A description will now be given with respect to an MR imaging technique according to modified embodiments. It should be noted that the components substantially identical to those in the prior art or in the first embodiment are denoted by identical reference numerals and description therefore will be omitted.

In a first modified embodiment, the MR imaging method comprises a first sequence including the step of applying the MTC pulse as described in the first embodiment and a second sequence for acquiring MR angiography image data.

In this embodiment, an RF shield member 31 is first provided to cover a portion of the examinee prior to applying the MTC pulse to the examinee 8.

Figure 4:
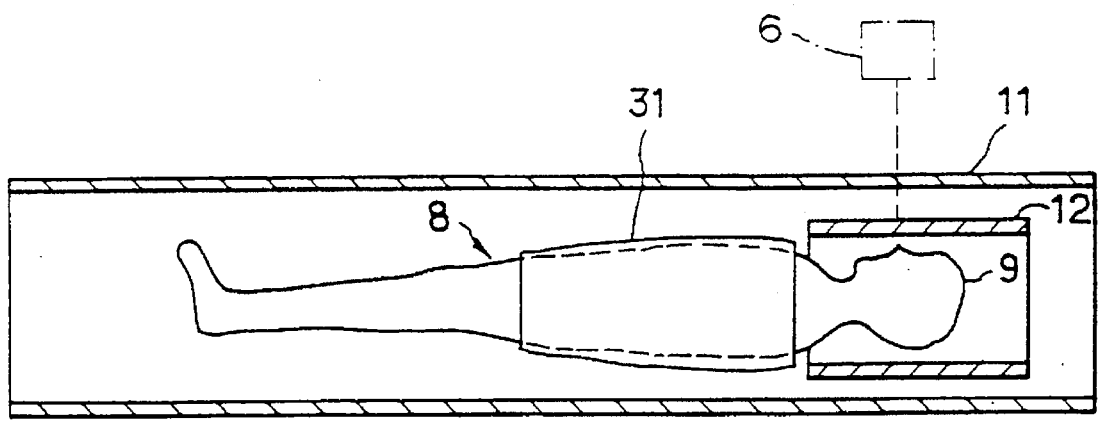
FIG. 4 is a view showing an MR imaging condition to an examinee according to one modification of the magnetic resonance imaging apparatus of the present invention.

FIG. 4 shows an example where an RF shield member 31 is wound around body portions from the neck and downwards of the examinee 8. The RF shield member 31 is preferably constructed by a conductive sheet such as a copper foil.

The MTC pulse is then applied to the examinee 8 from the whole body type RF coil 11. The MTC pulse is preferably constituted for example by a sinc pulse 14 and an offset pulse 15.

While the MTC pulse exiting the RF coil 11 is transmitted toward the examinee 8 as a whole, the flowing blood out of the heart flows into the head 9 without being excited by the MTC pulse because the RF shield member 31 is wound around the portions of the neck and downwards of the examinee 8.

For this reason, an intensive signal may be obtained from the flowing blood when the second sequence is subsequently executed to acquire MR image data on the imaging plane. It should be noted that, since the portion of the head 9 is excited by the MTC pulse, a predetermined MTC effect thereof may be obtained.

Figure 5:
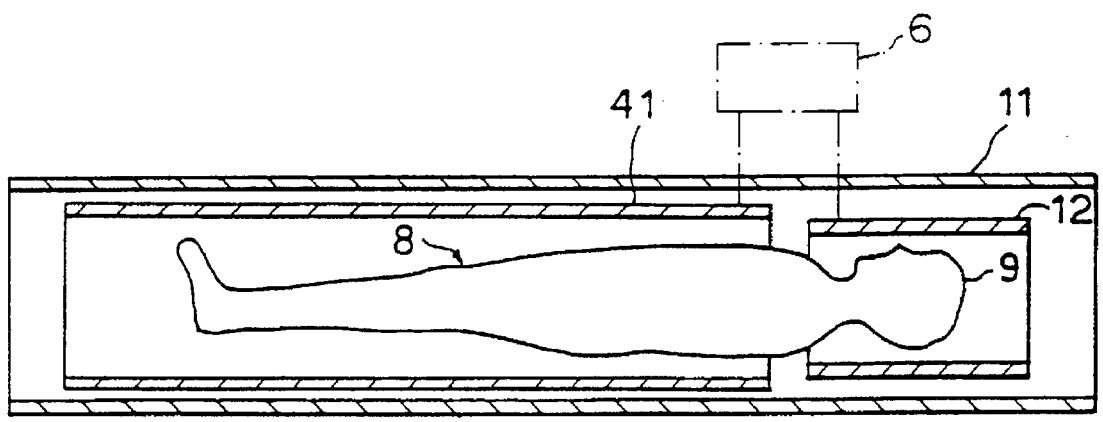
FIG. 5 is a view showing an MR imaging condition of an examinee according to another modification of the magnetic resonance imaging apparatus of the present invention.
Figure 6:
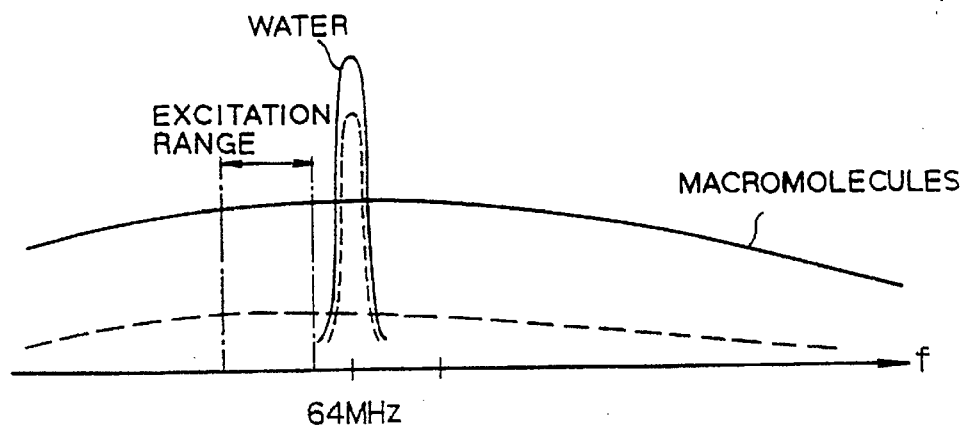
FIG. 6 is a view showing a spectral diagram of protons contained in water and in macromolecules.

In a second modified embodiment, such as shown in FIG. 5, an RF shield member 41 capable of providing a shield against the MTC pulse for the region of the neck and downward of the examinee 8, as shown in FIG. 5, is disposed just the inside of the whole-body type RF coil 11.

In this embodiment, the MTC pulse is first applied to the examinee 8.

Here, since the RF shield member 41 capable of providing shielding against the MTC pulse for the region of the neck and downward of the examinee 8 is disposed at the inside of the RF coil 11, the MTC pulse exiting the whole body type RF coil 11 is not applied to the portion of the neck and downward at which the RF shield member 41 is disposed, though it is transmitted toward the entire portions of the examinee 8.

Thus, the flowing blood having exited the heart flows into the head 9 which is the imaging region, without being excited by the MTC pulse.

As a result, an intensive signal may be obtained from the flowing blood when the second sequence is subsequently executed to gather MR image data on the imaging plane. It should be noted that, since the portion of the head 9 is excited by the MTC pulse, a predetermined MTC effect thereof may be obtained.

As has been described, in the MR imaging technique for executing a first sequence includes the step of applying the MTC pulse to the examinee and then executing a second sequence for gathering MR angiography image data related to a predetermined imaging surface. Since the MR imaging method of the present invention includes, in the above first sequence, the step of applying a slice gradient magnetic field for spatially selectively exciting a predetermined MTC excitation plane or surface at substantially the same timing as the MTC pulse, the MR angiography using an MTC pulse may be performed by employing various types of RF coil, especially, a whole body coil.

Further, a magnetic resonance imaging apparatus of the present invention comprises: gradient magnetic field application means capable of applying a predetermined gradient magnetic field in a manner overlapping a predetermined static magnetic field, RF transmitting/receiving means capable of transmitting an RF pulse to the examinee and of receiving an MR signal from the examinee, and control means capable of controlling the gradient magnetic field application means and the RF transmitting/receiving means. The control means is adapted to control the gradient magnetic field application means and the RF transmitting/receiving means in accordance with a predetermined pulse sequence, and the pulse sequence includes a first sequence for applying an MTC pulse and a second sequence for gathering MR image data. A slice gradient magnetic field for spatially exciting a predetermined MTC excitation plane is applied in the first sequence at substantially the same timing as the MTC pulse, so that the MR angiography using an MTC pulse may be performed by employing various types of RF coil, especially, a whole body coils.

What is claimed is:

1. A magnetic resonance imaging method utilizing a magnetization transfer contrast (MTC) effect, in which an examinee is placed under a static magnetic field and three dimensional magnetic resonance angiography is carried out for blood flowing into an imaging plane within the examinee, the method comprising the steps of:

executing a first pulse sequence for causing the MTC effect in an MTC excitation plane in the examinee, said first pulse sequence including the steps of:
applying a magnetization transfer contrast (MTC) pulse causing the MTC effect in the MTC excitation plane in the examinee, the MTC pulse being formed by superimposing an offset pulse and a spatial selective excitation pulse, said spatial selective excitation pulse for exciting protons contained in water in the examinee, said offset pulse for exciting protons contained in macromolecules in the examinee by having a frequency range shifted by an offset amount from a resonance frequency of said protons contained in the water, and
applying a slice gradient magnetic field at substantially the same timing as said application of said MTC pulse for positioning the MTC excitation plane adjacent a side of the imaging plane that is opposite to the side of the imaging plane where the blood to be imaged flows into the imaging plane; and
executing a second pulse sequence after said execution of said first pulse sequence for acquiring image data of the imaging plane for the three-dimensional magnetic resonance angiography.

2. The magnetic resonance imaging method according to claim 1, further comprising the step of shielding a portion of the examinee, other than a diagnostic portion that includes the imaging plane and the MTC excitation plane, by means of an RF shield member before the application of the MTC pulse to the examinee.

3. The magnetic resonance imaging method according to claim 1, wherein said offset amount is determined based on a strength of the slice gradient magnetic field and a distance between the MTC excitation slice and the imaging slice.

4. The magnetic resonance imaging method according to claim 1, wherein:
the first pulse sequence causes a larger MTC effect in the background parenchyma of the examinee than the inflowing blood to the image plane, and
the offset pulse excites protons contained in macromolecules of the parenchyma residing in the imaging plane.

5. The magnetic resonance imaging method according to claim 3, wherein said offset amount is over 500 Hz in frequency and a flip angle of said spatial selective excitation pulse is in a range of 6 µT to 78 µT when expressed in intensity of an RF magnetic field.

6. The magnetic resonance imaging method according to claim 3, wherein said spatial selective excitation pulse is either one of a sine pulse and a Gaussian pulse.

7. A magnetic resonance imaging apparatus utilizing a magnetization transfer contrast (MTC) effect, in which an examinee is placed under a static magnetic field and three-dimensional magnetic resonance angiography is carried out for blood flowing into an imaging plane within the examinee, the apparatus comprising:
means for executing a first pulse sequence for causing the MTC effect in an MTC excitation plane in the examinee, said first pulse sequence executing means including:
means for applying a magnetization transfer contrast (MTC) pulse causing said MTC effect in the MTC excitation plane in the examinee, the MTC pulse being formed by superimposing an offset pulse and a spatial selective excitation pulse, said spatial selective excitation pulse for exciting protons contained in water in the examinee, said offset pulse for exciting protons contained in macromolecules in the examinee by having a frequency range shifted by an offset amount from a resonance frequency of said protons contained in the water, and means for applying a slice gradient magnetic field at substantially the same timing as said application of said MTC pulse for positioning the MTC excitation plane adjacent a side of the imaging plane that is opposite to the side of the imaging plane where the blood to be imaged flows into the imaging plane; and means for executing a second pulse sequence after said execution of said first pulse sequence for acquiring image data of the imaging plane for the three-dimensional magnetic resonance angiography.

8. The magnetic resonance imaging apparatus of claim 7, wherein:

said first pulse sequence executing means includes a transmitting RF coil of a whole-body type, and said second pulse sequence executing means including a receiving RF coil covering only a diagnostic portion of the examinee that includes the imaging plane and the MTC excitation plane.

9. The magnetic resonance imaging apparatus of claim 8, further comprising:

an RF shield member positioned between the examinee and said transmitting whole-body type RF coil for shielding a non-examining portion of the examinee from the MTC pulse.

10. The magnetic resonance imaging apparatus of claim 7, wherein:

the first pulse sequence causes a larger MTC effect in the background parenchyma of the examinee than the inflowing blood to the image plane, and the offset pulse excites protons contained in macromolecules of the parenchyma residing in the imaging plane.

* * * * *